(12) United States Patent
Mehrotra et al.

(10) Patent No.: US 10,937,586 B2
(45) Date of Patent: Mar. 2, 2021

(54) ELECTROMAGNETIC DEVICE HAVING LAYERED MAGNETIC MATERIAL COMPONENTS AND METHODS FOR MAKING SAME

(71) Applicant: Teledyne Scientific & Imaging, LLC, Thousand Oaks, CA (US)

(72) Inventors: Vivek Mehrotra, Simi Valley, CA (US); Rahul Ganguli, Oak Park, CA (US); Jennifer Kuo, Newbury Park, CA (US); Payam Minoofar, Ventura, CA (US); Robert Mihailovich, Newbury Park, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 34 days.

(21) Appl. No.: 15/229,975

(22) Filed: Aug. 5, 2016

(65) Prior Publication Data
US 2017/0053728 A1    Feb. 23, 2017

Related U.S. Application Data

(60) Provisional application No. 62/202,048, filed on Aug. 6, 2015.

(51) Int. Cl.
| | |
|---|---|
| *H01F 27/245* | (2006.01) |
| *H01F 27/28* | (2006.01) |
| *H01F 41/02* | (2006.01) |
| *H01L 49/02* | (2006.01) |
| *H01F 41/24* | (2006.01) |
| *C22C 19/07* | (2006.01) |
| *C22C 19/03* | (2006.01) |

(52) U.S. Cl.
CPC .......... *H01F 27/245* (2013.01); *C22C 19/03* (2013.01); *C22C 19/07* (2013.01); *H01F 27/28* (2013.01); *H01F 41/02* (2013.01); *H01F 41/0233* (2013.01); *H01F 41/24* (2013.01); *H01L 28/10* (2013.01)

(58) Field of Classification Search
CPC . H01F 27/245; H01F 27/2455; H01F 27/2847
USPC .................................................. 336/217, 234
See application file for complete search history.

(56) References Cited

U.S. PATENT DOCUMENTS

| | | | | |
|---|---|---|---|---|
| 1,715,543 A | * | 6/1929 | Elmen ....................... | H01F 1/14 148/101 |
| 2,374,449 A | * | 4/1945 | Mulcahy ............... | H01F 27/245 204/268 |

(Continued)

FOREIGN PATENT DOCUMENTS

JP                06151202 A   *   5/1994

*Primary Examiner* — Tszfung J Chan
(74) *Attorney, Agent, or Firm* — Glenn H. Lenzen; Dietze and Davis, P.C.

(57) ABSTRACT

A micro fabricated electromagnetic device and method for fabricating its component structures, the device having a layered magnetic core of a potentially unlimited number of alternating insulating and magnetic layers depending upon application, physical property and performance characteristic requirements for the device. Methods for fabricating the high performing device permit cost effective, high production rates of the device and its component structures without any degradation in device performance resulting from component layering.

6 Claims, 11 Drawing Sheets

(56) References Cited

U.S. PATENT DOCUMENTS

| | | | | | |
|---|---|---|---|---|---|
| 2,479,417 | A | * | 8/1949 | Schulman | H01B 3/04 |
| | | | | | 174/121 SR |
| 2,739,085 | A | * | 3/1956 | McBride | C23C 24/00 |
| | | | | | 106/801 |
| 2,968,087 | A | * | 1/1961 | Thompson | H01F 27/25 |
| | | | | | 29/605 |
| 3,110,613 | A | * | 11/1963 | Bean | H01F 10/10 |
| | | | | | 336/234 |
| 3,297,970 | A | * | 1/1967 | Jones | H01F 27/327 |
| | | | | | 174/120 R |
| 4,200,680 | A | * | 4/1980 | Sasazawa | G11B 5/70673 |
| | | | | | 427/128 |
| 4,608,297 | A | * | 8/1986 | Shimada | B82Y 25/00 |
| | | | | | 360/125.01 |
| 5,061,554 | A | * | 10/1991 | Hjortsberg | C08K 3/22 |
| | | | | | 174/110 N |
| 5,166,965 | A | * | 11/1992 | Collier | H02M 7/10 |
| | | | | | 336/200 |
| 5,331,304 | A | * | 7/1994 | White | H01F 27/25 |
| | | | | | 336/206 |
| 6,917,275 | B2 | * | 7/2005 | Ono | C08L 71/00 |
| | | | | | 336/233 |
| 2005/0156704 | A1 | * | 7/2005 | Gardner | H01F 17/0006 |
| | | | | | 336/232 |
| 2008/0068121 | A1 | * | 3/2008 | Fukui | H01F 27/25 |
| | | | | | 336/219 |
| 2011/0050376 | A1 | * | 3/2011 | Gerster | F02M 51/0653 |
| | | | | | 335/281 |
| 2012/0182769 | A1 | * | 7/2012 | Yonezawa | H02M 1/34 |
| | | | | | 363/21.12 |

\* cited by examiner

Wafer with Test Microbeams, Plated to 30 CoNiFe/Ferrite Layers

FIG. 7

Ring Wafer with 100 CoNiFe/Ferrite Layers Differential Mass Gain with Layering

ELECTROMAGNETIC DEVICE HAVING LAYERED MAGNETIC MATERIAL COMPONENTS AND METHODS FOR MAKING SAME

CROSS-REFERENCE TO RELATED APPLICATIONS

This application claims the benefit of U.S. Provisional Patent Application Ser. No. 62/202,048, filed on Aug. 6, 2015, and entitled Electromagnetic Device Having Layered Magnetic Material Components and Methods for Making Same, the entire disclosure of which is incorporated herein by reference.

RIGHTS OF THE U.S. GOVERNMENT

This invention was made with Government support under Contract No. DE-AR0000113 awarded by the Department of Energy (DOE) on behalf of the Advanced Research Projects Agency-Energy (ARPA-E). The Government has certain rights in the invention.

FIELD OF THE INVENTION

The present invention relates to electromagnetic devices, integrated circuits and semiconductor chips having magnetic cores formed of layered magnetic materials and films. More specifically, the present invention relates to layered magnetic materials and films for application in micro fabricated magnetic devices, transformers, power supplies and the like and methods for manufacturing the same.

BACKGROUND OF THE INVENTION

The quest for downsizing electronic equipment and, in particular, the integrated circuits ("IC's") upon which much of such equipment's control and operational systems' functionality is based, is an unending effort. In recent years, the downsizing of electronic equipment has been remarkable and in no small measure is dependent upon and may be measured by the ability to integrate a large number of electronic components onto a single computer processor microchip. The nomenclature in common use therefor in the industry reflects the effort and technological advances made in this technology, progressing from large-scale integration ("LSI"), no longer in use, to very large-scale integration ("VLSI") and now to ultra-large-scale integration ("ULSI") in which literally millions of transistors may be embedded on a single chip.

While shrinkage in component size in such equipment has progressed dramatically, with a corresponding dramatic increase in computing and signal processing capability per unit volume, the decrease in size and weight of power supplies and other electromagnetic devices necessary for equipment operation has not kept pace. The size and weight of power supplies are a function of the size, weight and operating characteristics of their reactive components, more specifically, the transformers, inductors and capacitors used therein.

Shrinking a transformer for power conversion applications, particularly in the higher frequency ranges of 1-5 MHz, down to the size of a simple chip device is particularly challenging. A significant problem associated with power supplies and transformers is heat generation, a form of energy loss often arising in part from the generation of eddy currents in the material forming the components of the device. Silicon substrates do not generally withstand heat well, and researchers in the field have sought to minimize heat generation and/or devise means of quickly dissipating heat before it adversely affects device functionality.

Efforts to create functional electromagnetic devices in the size ranges suitable for microprocessor applications require a fine balance of a material's or a material combination's inherent physical, electrical and magnetic properties on the one hand, and its manufacturing and processing capabilities, on the other. In particular, for high frequency electromagnetic devices, ideal materials would be the so-called "soft" magnetic materials, i.e., materials that possess unique combinations of properties such as high magnetization saturation, high magnetic permeability and inductance, low coercivity and low energy losses. However, eddy currents which build up in thicker layers of material seriously disrupt the magnetic fields generated therein, reduce inductance and increase heat in the device, all of which degrade device performance. Moreover, manufacturing difficulties involving cracking, porosity, and electrical shorting in various layers and accompanying degradation of the high frequency magnetic characteristics of the device have been problematic.

For example, U.S. Pat. No. 6,207,303 issued Mar. 27, 2001, to Tomita discloses a Multilayered Magnetic Film Having Buffer Layer Inserted Between Resin Layer and Laminated Magnetic Film Layer and Thin film Inductor Using the Same (the "'303 patent"). The '303 patent discloses a multilayered magnetic film deposited on a silicon substrate that is manufactured by sequentially depositing a resin layer on the silicon substrate, a buffer layer disposed intermediate a portion of the resin layer and a multilayered magnetic film layer containing iron (Fe), cobalt (Co), boron (B), and carbon (C) having a large in-plane uniaxial anisotropy. The magnetic film layer includes one or more insulation layers and a buffer layer of silicon nitride intermediate an underlying resin layer and the magnetic film layer in an attempt to reduce or minimize these defects. However, Tomita's disclosure, while effective on thin structures, does not solve the afore-mentioned problems when multilayered devices of greater thickness are desired.

Zhao et al report success in manufacturing a high quality iron-nickel-silicon dioxide (Fe—Ni—$SiO_2$) material using a base-catalyzed sol-gel process. Zhao et al., *Exchange-Coupled Soft Magnetic FeNi-$SO_2$ Nanoparticles*, J. Phys. Chem. B 2004, 108, 3691-3693. However, the process disclosed by these researchers requires the application of relatively high pressures to compact the final material into usable form, a process which is not readily applicable to commercial production of thicker layers.

More recently, Rhen et al. disclose an electro deposition process to which phosphorous is added to a Co—Ni—Fe alloy to increase its resistivity. However, the films manufactured using the newly disclosed process exhibit poor morphology in the form of cracks and a higher coercivity, as noted above, another undesirable result. Rhen et al., *IEEE Transactions on Magnetics*, Vol. 44, No. 11 at 3917, November, 2008.

In view of the above, it will be apparent to those skilled in the art that a need exists for a multilayered magnetic material for a micro fabricated electromagnetic device in which all of the device components, by way of example, a magnetic core, induction coils, transformers and interconnects therebetween, are integrated into robust multiple layers having no layer or thickness limit so as to provide enhanced performance at MHz frequencies over prior art devices. A need also exists for an improved chemical/ electrochemical manufacturing process to enable processing of micro fabricated electronic components at extended, unlimited layers having higher performance characteristics at MHz switching frequencies than heretofore attainable with conventional plating processes. The present invention addresses these needs in the art as well as other needs, all of which will become apparent from the accompanying disclosure.

SUMMARY OF THE INVENTION

In an embodiment, the layered magnetic material and process for the making thereof of the present invention address the aforementioned problems associated with the prior art by providing a layered magnetic material having an unlimited number of layers of electroplated Co—Ni—Fe alloy laminated with functionalized magnetic nanomaterial such as magnetite or ferrite and which demonstrates generally overall higher performance at high frequencies in the form of enhanced exchange coupling and magnetic saturation and lower coercivity and energy loss than prior art layered magnetic materials.

In another embodiment, a manufacturing process is provided which enables the electrochemical processing of the better performing micro fabricated components of the layered magnetic structure of the present invention under mild plating conditions at a cost-effective, higher production rate without limitations on layering.

In another embodiment, a unique electromagnetic device is provided which has a compact, tightly coupled coil and magnetic laminated core formed of a layered magnetic material in accordance with an embodiment.

In yet another embodiment, a process for the fabrication of an electromagnetic device and the elements thereof is provided in accordance with an embodiment.

These and other features of the present invention will be apparent from the accompanying figures, description of the invention and the appended claims.

BRIEF DESCRIPTION OF THE FIGURES

FIG. 3.A is an enlarged cross-sectional view of the segment of the micro fabricated electromagnetic transformer device of FIG. 3;

FIG. 5.A. shows graphically magnetic density vs. applied magnetic field in a single-layered structure of magnetic materials of in accordance with the composition of an embodiment to demonstrate the ability to control magnetic properties of the material via material composition;

FIG. 5.B. shows graphically magnetic density vs. applied magnetic field in an eleven-layered structure of a magnetic material in accordance with an embodiment to demonstrate the ability to control magnetic properties of the material via layering;

FIG. 11.A is an enlarged photomicrograph of a portion of the cross section of a prior art layered magnetic material of FIG. 11;

DESCRIPTION OF THE INVENTION

It should be noted that the present description is by way of illustration only, and that the concepts and examples presented herein are not limited to use or application with any single layered magnetic material and manufacturing process. Hence, while the details of the layered magnetic material and process for the making thereof described herein are for the convenience of illustration and explanation with respect to the exemplary embodiments, the principles disclosed may be applied to other types of layered magnetic materials and associated manufacturing processes without departing from the scope of the present invention.

Figure 1:
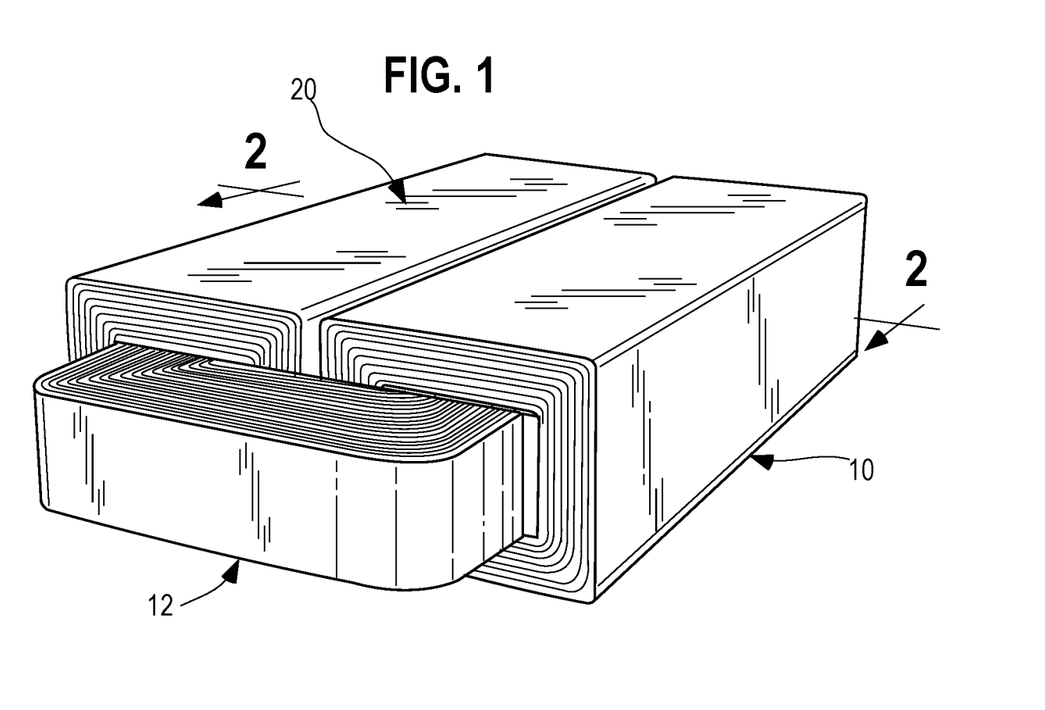
FIG. 1 is a perspective view of a micro fabricated electromagnetic transformer device having a layered magnetic laminate core.

Referring now to FIG. 1, a unique micro fabricated electromagnetic transformer device in accordance with the present invention is illustrated generally at 10. The device is designed to address demanding application requirements and includes a copper coil 12 having arms 13, each arm being wrapped around with and tightly coupled to a compact and continuous, closed-loop laminated magnetic core 20, thus creating a monolithic integration of the coil and core. Tight coupling, as that term is used in the art, refers generally to the amount of flux created in an alternating magnetic field in a transformer coil that is received by the receiving coil. The greater the amount of flux that is received by the receiving coil, the tighter the coils are coupled; thereby reducing heating and enhancing efficiency.

Figure 2:
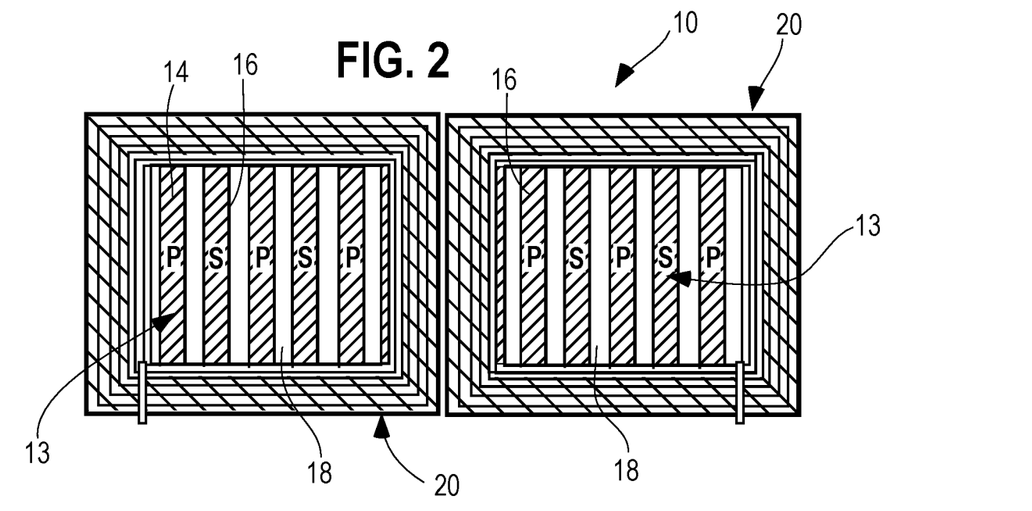
FIG. 2 is a cross-sectional view of the micro fabricated electromagnetic transformer device of FIG. 1 showing the elements thereof in greater detail.

As shown in greater detail in FIG. 2, the copper coil 12 includes a plurality of planar copper primary and secondary windings 14 (further designated for ease of identification by P for Primary and S for Secondary windings of the transformer respectively) in a thickness range of approximately 50 μm to approximately 450 μm and coated with an organic isolation coating material layer 16, for example, Parylene. The windings are separated by layers of silicon 18 positioned intermediate the windings and further include a plurality of out-of-plane crossovers, each of which, by way of example and not of limitation, are approximately 50 µm thick that are not visible in the drawings.

Figure 3:
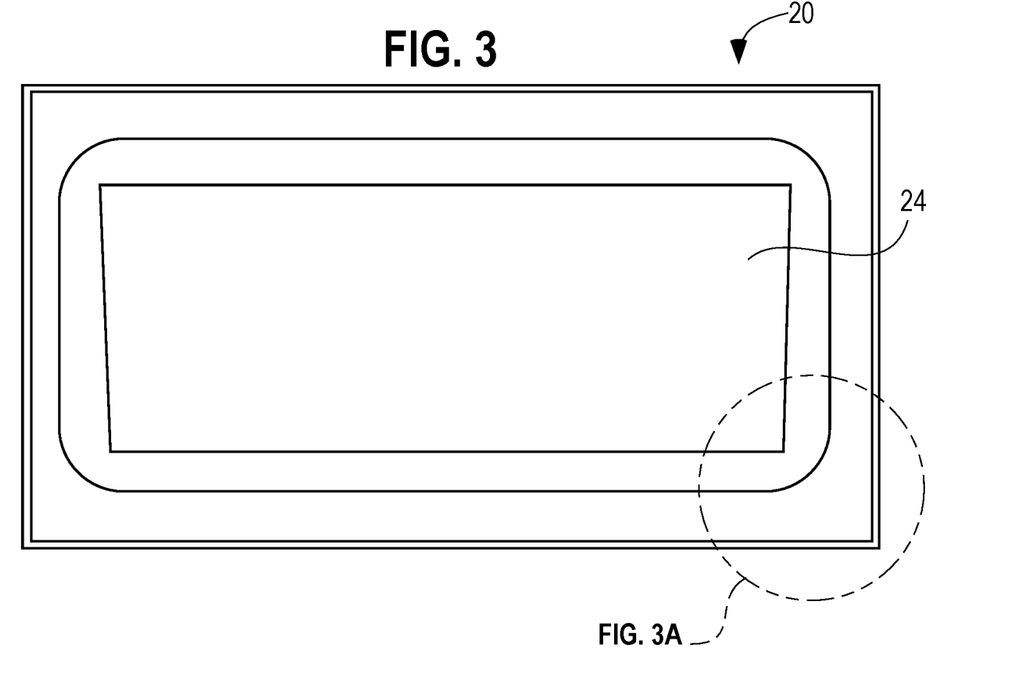
FIG. 3 is a cross-sectional view of a segment of the micro fabricated electromagnetic device of FIGS. 1 and 2 having a portion enlarged to better illustrate the elements thereof.
Figure 3A:
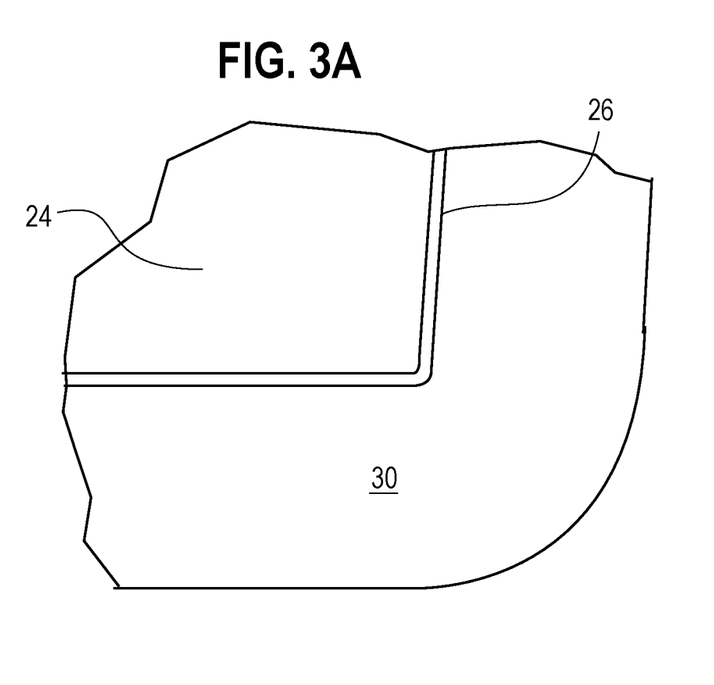

Referring to FIGS. 3, and 3.A., a portion of the continuous, closed-loop laminated magnetic core 20 is depicted in greater detail. The laminated core includes a silicon microbeam 24 which is covered with a seed layer or substrate 26 of suitable dielectric material such as Parylene as noted above or other vapor deposited polymers suitable for the application. The magnetic core further includes a micro fabricated laminated multilayered magnetic structure 30 formed of a first core layer of cobalt-nickel-iron (Co—Ni—Fe) alloy magnetic material and an iron oxide insulating material or layer deposited on and operatively connected to the seed layer. Thereafter, alternating layers of Co—Ni—Fe alloy material and iron-oxide insulating material sequentially are deposited on and operatively connected to one another until a magnetic core of a desired thickness and having properties suitable for an intended application is formed. The overall thickness of the laminate having approximately 150 to 200 layers of material is on the order of approximately 250 µm; although, laminates of fewer or more numbers of layers of laminate core materials in varying thicknesses may be used, depending upon the needs of a specific application, without departing from the scope of the present invention.

Figure 4:
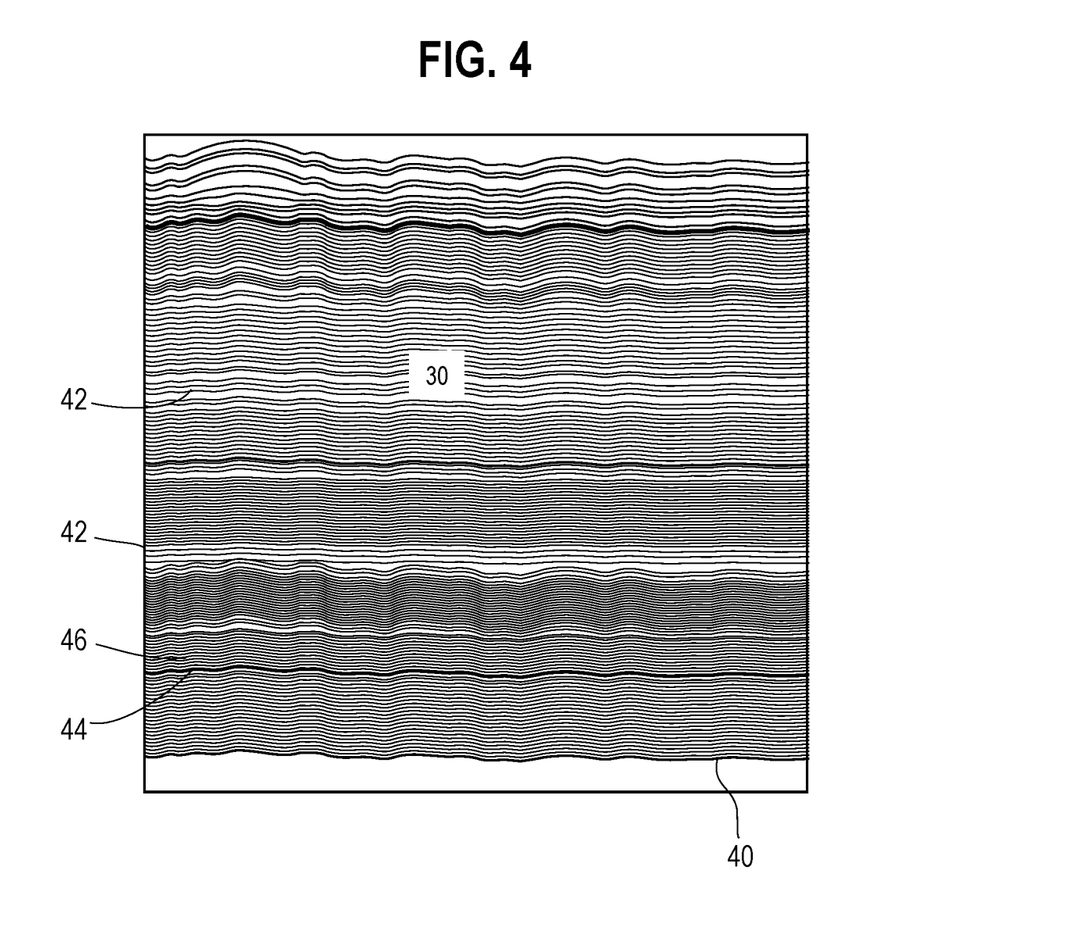
FIG. 4 is a cross-sectional electron micrograph of a 100 layer, 200 μm thick plated test wafer of a layered magnetic material in accordance with an embodiment.

An enlarged cross-sectional electron micrograph of the microstructure of one segment of the laminated multilayered magnetic structure 30 is shown magnified in FIG. 4 to better illustrate the structure's individual layers. As discussed above, these layers comprise alternating layers of a magnetic material such as a cobalt-nickel-iron alloy and an insulating material such as ferrite (a solid solution of carbon in α-Fe having a body-centered cubic (BCC) crystal structure), hematite ($Fe_2O_3$) or magnetite ($Fe_3O_4$). The specifics of these materials will be discussed in greater detail below.

Figure 5A:
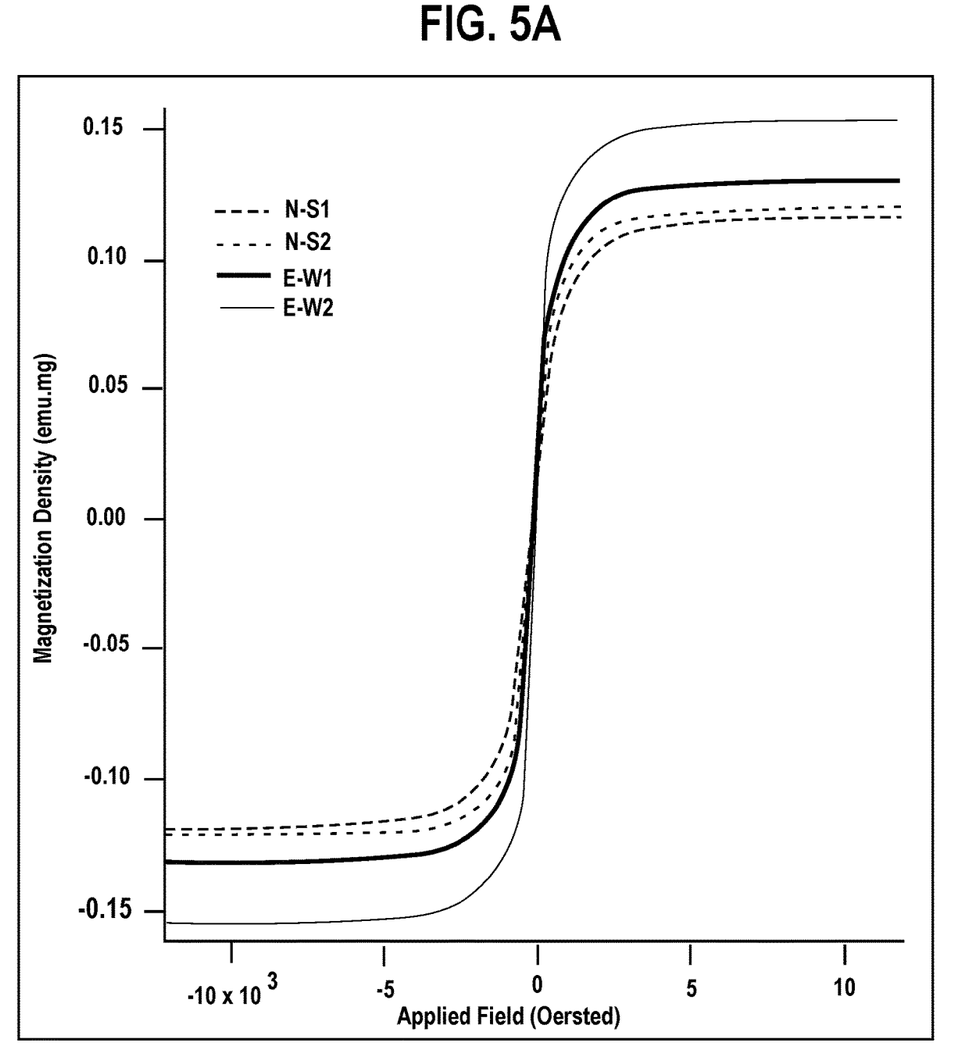
Figure 5B:
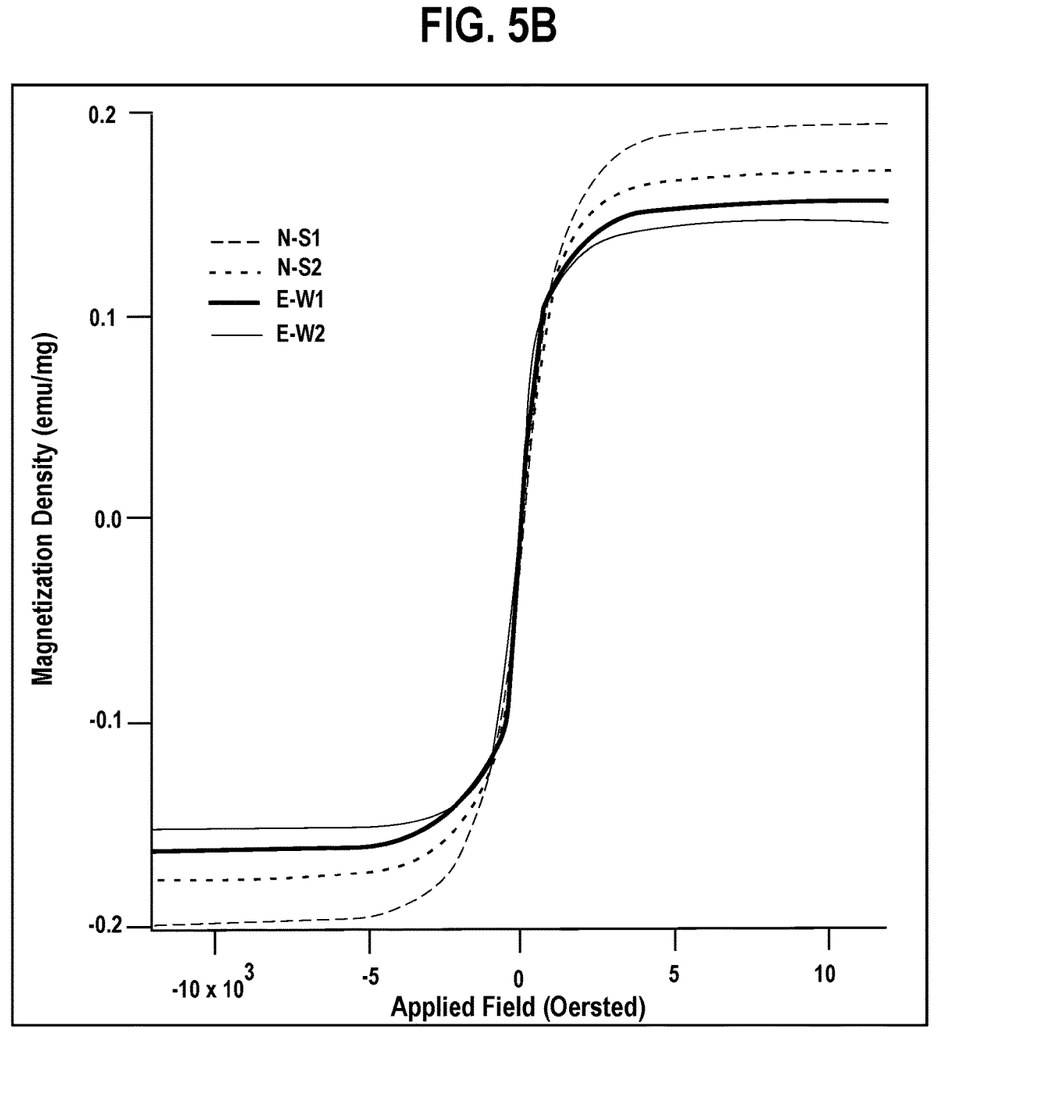

A particular advantage of the layered magnetic material of the present invention and the associated manufacturing method is the ability to control the magnetic properties of the material. FIGS. 5.A and 5.B. are both magnetization curves along multiple N-S and E-W magnetic poles, which show the effects of and layering of a Co—Ni—Fe alloy formed in accordance with the composition changes herein disclosed on saturation and coercivity. Saturation is a term used to describe the magnetization state of a material when an increase in an applied external magnetic field cannot further increase the magnetization of the material. This property is illustrated in the upper right and lower left portions of the curves in both FIGS. 5.A. (one layer) and 5.B. (11 ferrite layers), where the magnetization density levels off to a relatively constant value, even though strength of the applied field in either direction shown along the horizontal axis increases steadily from the zero point. The material is magnetically saturated at these points.

Coercivity is a measure of the strength of an applied magnetic field needed to reduce the magnetization of a particular material to zero after it is saturated. An interrelated parameter, magnetic permeability, is the ability of a material to support a magnetic field within itself, pure iron (Fe), by way of example, having a higher permeability than air. Materials with high coercivity are known as magnetically hard materials, and materials with low coercivity are said to be magnetically soft materials.

Soft materials are used in electrical power transformers and inductor cores and, accordingly, are important materials for efforts to miniaturize power supplies and transformers for microchip applications, as noted above. However, heretofore, problems associated with layering of thin film magnetic materials have limited efforts to downsize these electronic components for semiconductor applications to approximately 10 to 20 layers as a result of progressive deterioration of magnetic properties and device performance as the number of layers increases.

Referring again to FIG. 4, the photomicrograph of the microstructure of a laminated multilayered magnetic structure 30 of the present invention which overcomes the aforementioned problems is illustrated at 700× magnification to show the sequential interrelationship and positioning of the layers thereof. The structure shown is a 100 layer, 200 µm plating wafer consisting of ring test structures or layers at approximately 0.08 gm/layer. This structure comprises a number of layers well above the number of layers found in prior art devices and demonstrates the robust layering capabilities of the novel layering material and manufacturing process of the present invention.

The laminated multilayered magnetic structure 30 comprises a substrate 40, which in the embodiment shown is silicon; however, as discussed above, it is to be understood that other substrate materials may be used without departing from the scope of the present invention. One or more layers 42 of the multilayered magnetic structure 30 forming magnetic laminate core 20 (FIGS. 1 and 2) are sequentially deposited on the substrate, the first of these layers being operatively connected to it via chemically bonding as a result of the plating manufacturing process, as will be described in greater detail below. Each core layer 42 further includes a first layer of magnetic material 44 and a second layer of insulating material 46. By way of example and not of limitation, each first layer of magnetic material may be formed of a cobalt-nickel-iron (Co—Ni—Fe) alloy having an exemplary composition of cobalt in a range of approximately 25% to approximately 45%, nickel in a range of approximately 45% to approximately 65%, and iron in a range of approximately 1% to approximately 18%. The second layer 46 of insulating material comprising the core may be an electroless iron oxide or ferrite, for example, hematite ($Fe_2O_3$) or magnetite ($Fe_3O_4$), both naturally occurring magnetic materials of the spinel group. While other insulating materials suitable for the application may also be used, such a goethite (SeOOH), cobalt ferrites, or cobalt nickel ferrites, without departing from the scope hereof, magnetite is a preferred material, inasmuch as it possesses the highest exchange coupling properties, i.e., the exchange of magnetic flux (not electrons) between adjacent material layers. As will be discussed in greater detail below, magnetite may also be applied or deposited in extremely thin layers, thus further enhancing the exchange coupling between layers.

Figure 6:
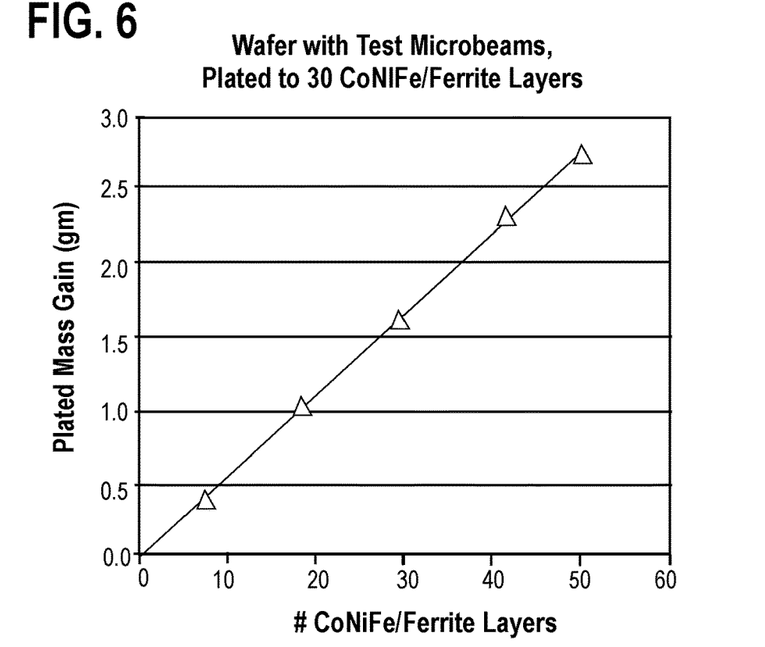
FIG. 6 is a graph of the mass gain as a function of the number of layers on the plated test wafer of FIG. 3.
Figure 7:
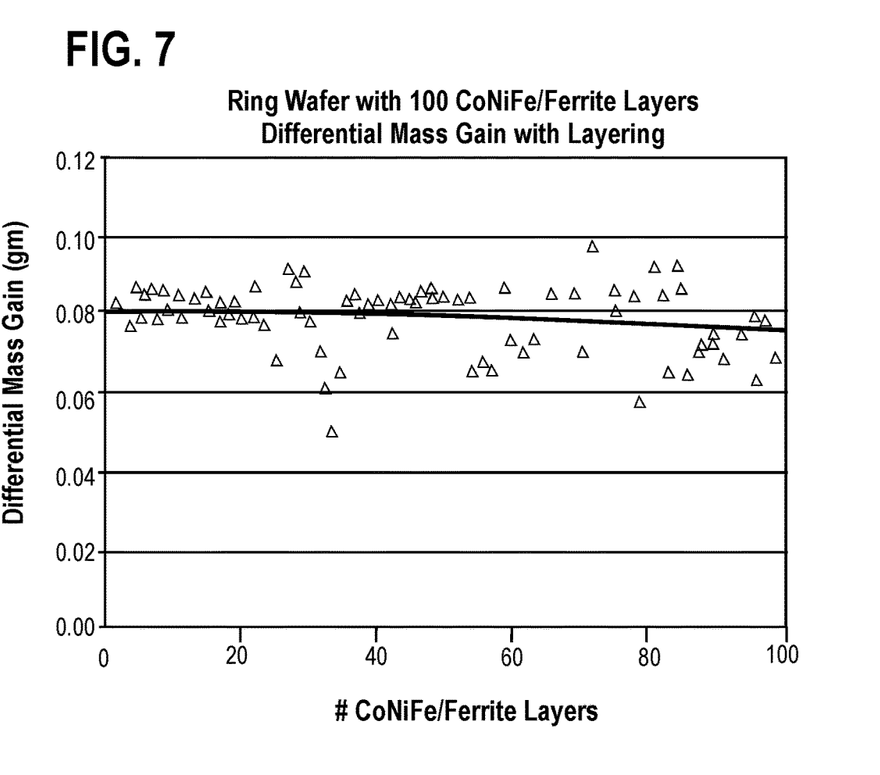
FIG. 7 is a graph of the differential mass gain as a function of the number of layers on the plated test wafer of FIG. 3.

Referring now to FIGS. 6 and 7, mass gain and the differential mass gain test data respectively are shown graphically as a function of layering. FIG. 6 displays the relatively uniform mass gain test data for platings around a cantilever test structure manufactured in accordance with the present invention as a function of the number of Co—Ni—Fe layers deposited. FIG. 7 illustrates uniform differential mass gain data as a function of the number of Co—Ni—Fe layers deposited on a test ring wafer. Using the novel materials and manufacturing methodology herein disclosed, no limits on the number of possible layers have been encountered, and laminates of Co—Ni—Fe/iron oxide (electroless ferrite) with high relative permeability (greater than 300 H/m) in 100 µm thick laminations have been produced. Moreover, unlike the insulating layers in prior art structure which are relatively thick, on the order of magnitude of 10 to 100 µm, to keep the insulation between alternating conductive layers robust, the insulating layers in the layered material of the present invention are in a range of approximately 0.05 to approximately 0.5 µm and preferably approximately 0.1 µm thick. The novel layering structure of the present invention minimizes the potential of electrical shorting between the layers and contributes to the overall permeability of the laminate, enhances exchange coupling between the materials, and reduces loss of inductance at higher switching frequencies via eddy current loss and other effects which have a significant negative impact upon the performance of prior art devices.

Figure 8:
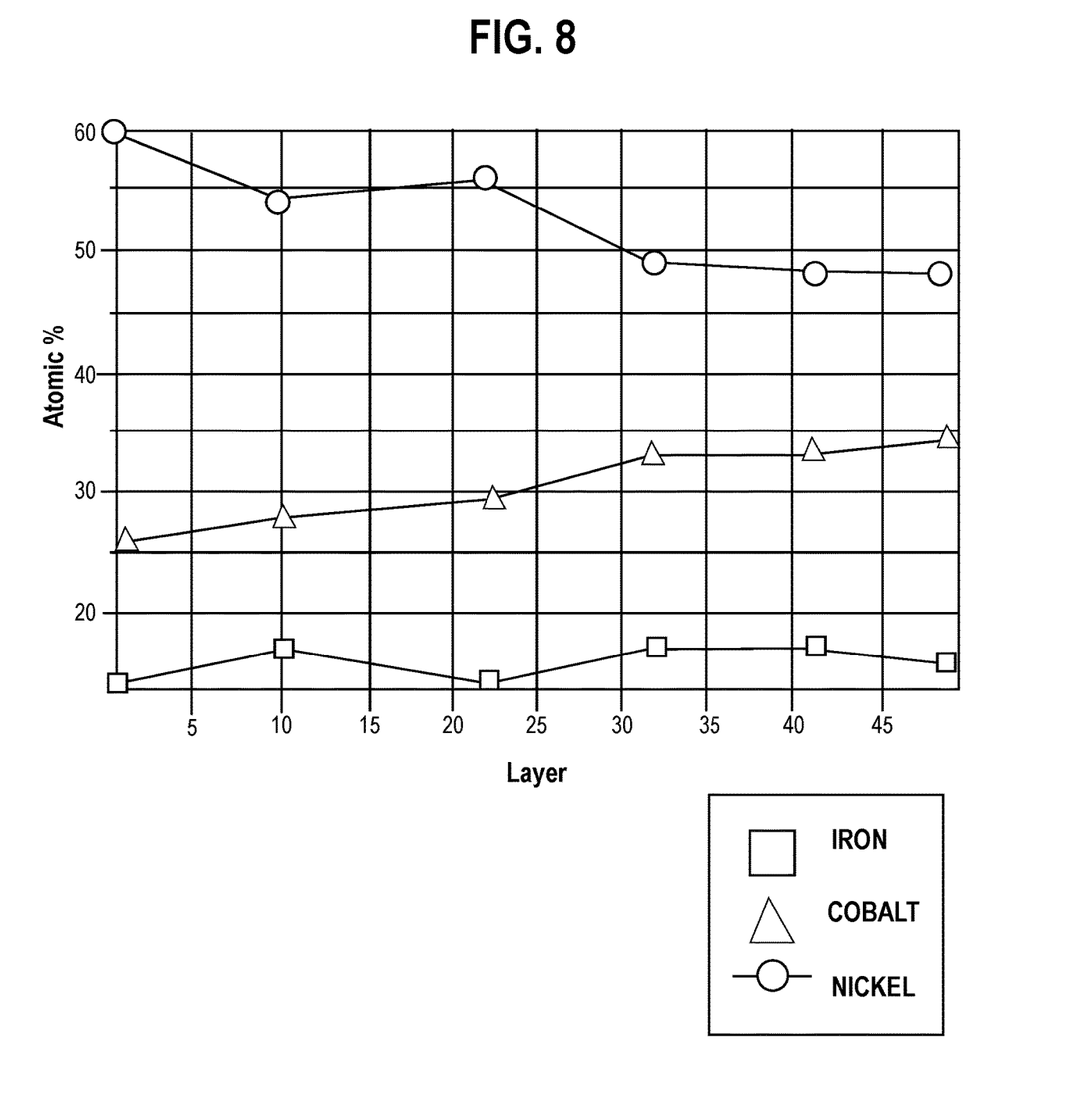
FIG. 8 is a graph of the material composition by layer as a function of the number of layers on the plated test wafer of FIG. 3 showing the consistency of layering composition deposited in accordance with the methods of the present invention.
Figure 9:
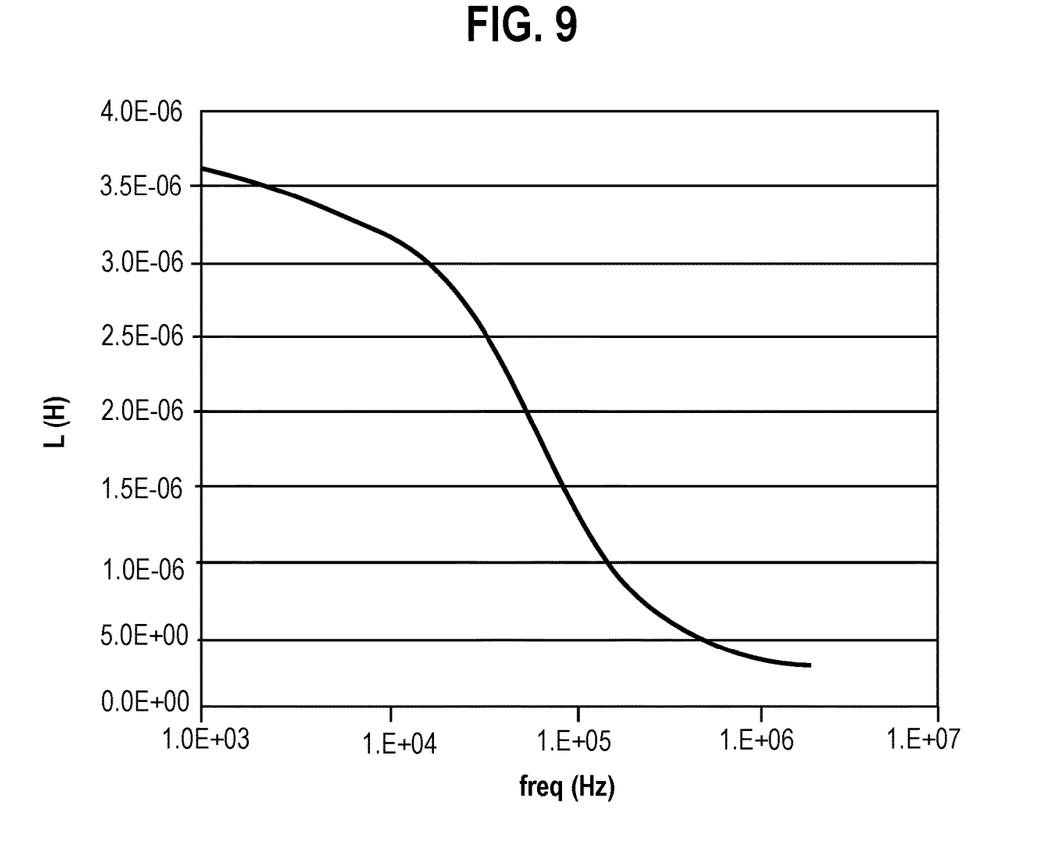
FIG. 9 is a graph of inductance as a function of frequency in a primary coil of a transformer having a 50-layer core showing the effectiveness of layering on the physical properties of the material.
Figure 10:
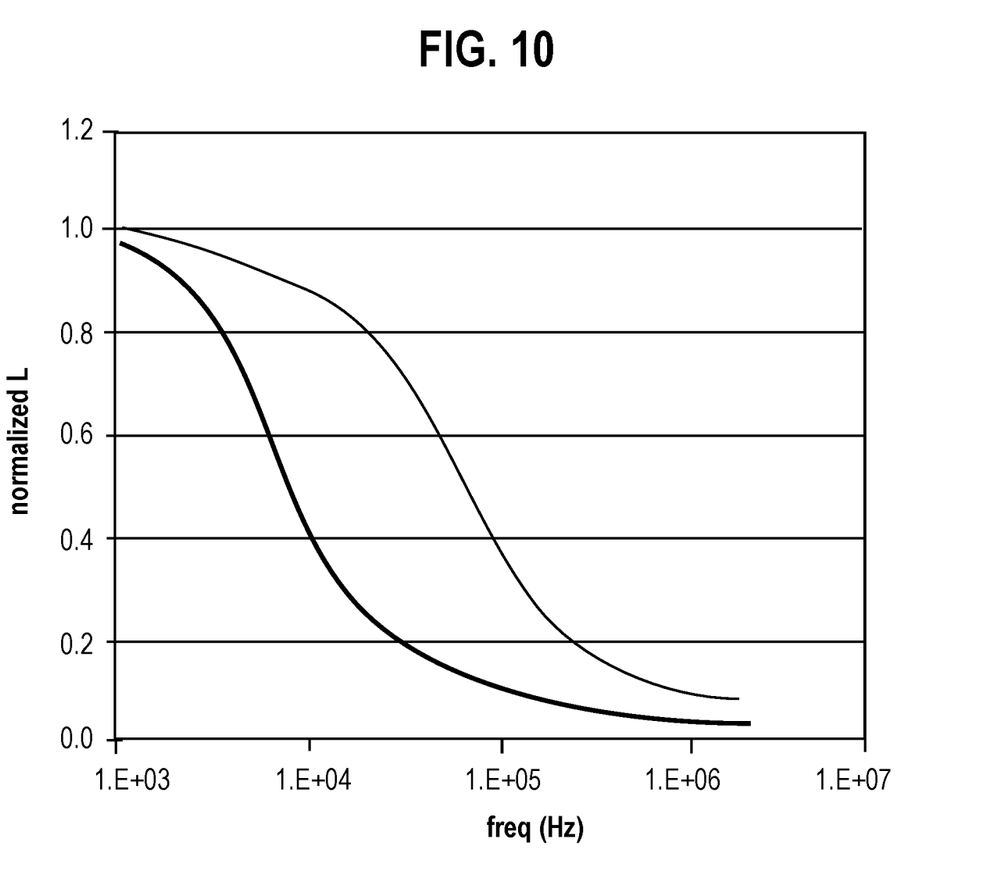
FIG. 10 is a graph of the data shown in FIG. 9 normalized to more clearly illustrate the effects of layering on the physical properties of the material.

FIGS. 8, 9 and 10 show the effectiveness of the layering process of the present invention. It may be seen from FIG. 8 that the relative composition by layer of the key elements remains constant over at least fifty layers and no limits on the number of layers appear to exist. This effectiveness is further demonstrated in a comparison of the performance of a multilayered material as a function of frequency of a 5:1 transformer having fifty layers as shown graphically in FIG. 9 and normalized as shown graphically in FIG. 10.

Figure 11:
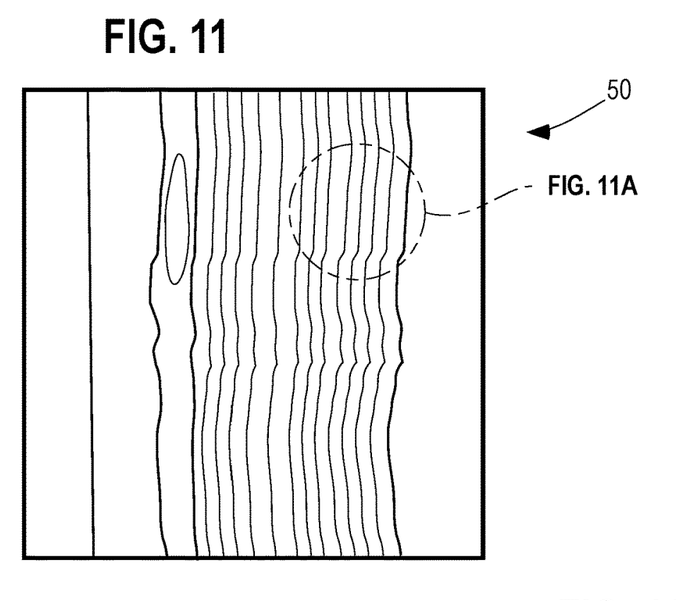
FIG. 11 is a photomicrograph of a cross section of a prior art layered magnetic material showing the adverse effect of Ni content on the growth of successive layers in the structure.
Figure 11A:
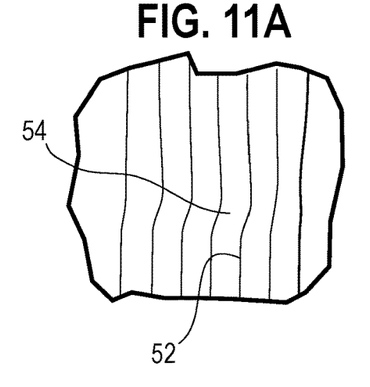
Figure 12:
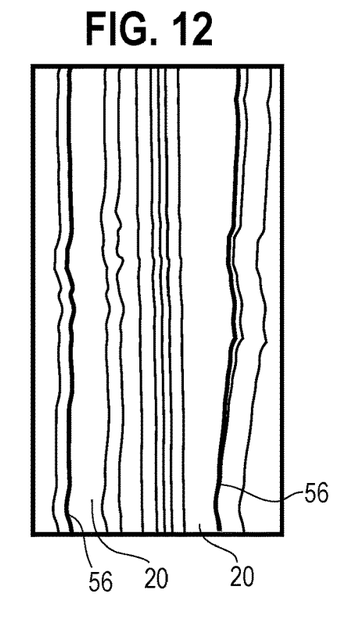
FIG. 12 is a photomicrograph of a cross section of a layered magnetic material illustrating the positive effect of the electrodeposition of a thin layer of Co on the growth of successive layers in the structure.

It has been found that pure nickel forms a passivating oxide layer on its surface, which inhibits the formation of magnetite thereon. This phenomenon is illustrated in FIGS. 11 and 11.A, which is a rendering of a photomicrograph of a cross section of a prior art layered magnetic material core 50 showing the adverse effect of Ni content on the growth of the magnetite insulation layers 52 on the inert nickel surfaces of the magnetic layers 54. To overcome this problem, a very thin layer of cobalt is deposited intermediate the one or more core layers 50 at preselected layer intervals. As noted above with respect to the insulating material layers, in the same manner, the cobalt material should be layered as thinly as possible, approximately 0.5 µm or less. For example, in the embodiment of FIG. 12, a very thin cobalt layer 56 is shown positioned intermediate the magnetic laminate core layers 20 to produce a non-inert layer that facilitates the iron oxide deposition and successive layering. It has been shown that depositing a cobalt layer at every fifth magnetic core layer interval is effective in overcoming this problem. Moreover, it has been observed that depending upon the number of core layers and resulting thickness of the final overall structure of the microelectronic device, positioning a cobalt layer at every tenth magnetic core layer interval provides satisfactory magnetite bonding.

Ferrite/Magnetite Insulating Layer Forming Process

Figure 13:
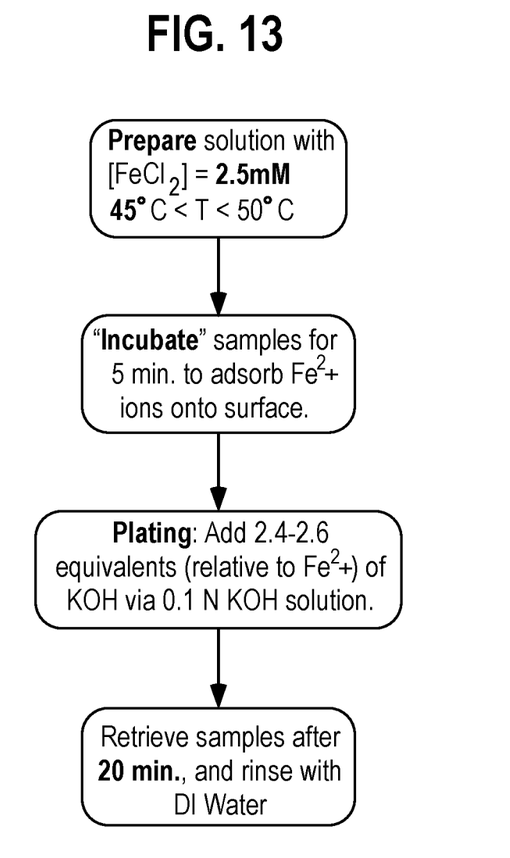
FIG. 13 is a flow chart of a process for manufacturing an insulating layer of a layered magnetic material in accordance with an embodiment.

Referring now to FIG. 13, a process flow chart is shown which describes the steps of manufacturing the insulating or ferritic layer of the multilayered magnetic structure of the present invention. As noted above, which various insulating materials are available for the instant application, electroless iron oxide or ferritic materials, preferable magnetite are preferred due to their height exchange coupling properties. This process protocol is the base procedure for plating in a medium-sized water bath in which all volumes and masses disclosed should be adhered to as accurately as possible. The process variables and parameters may be scaled up or down according to the requirements of a specific application.

1. Equip a glass water bath with a mechanical stirrer.
2. Fill water bath with approximately 400 mL of deionized (DI) water, and heat it to approximately 50° C. with gentle stirring with the mechanical stirrer.
3. Suspend the area of a substrate material to be coated in the water bath. Immerse the material in the water if water level is not high enough to cover desired area.
4. Once temperature has reached approximately 43° C., initiate the reaction by adding approximately 0.20 g $FeCl_2 \cdot 4H_2O$ (ferrous chloride tetrahydrate, formula weight (FW)=198.81 g/mol) to make approximately a 0.0025 M (2.5 mM) solution.
5. Increase the stirring rate so that the solution is stirring vigorously, and let the sample sit for approximately 10 minutes in the ferrous chloride solution. This is the critical phase in which ferrous ions ($Fe^{2+}$) are adsorbed onto the surface of the substrate. This adsorption period can be extended to a maximum of 20 minutes as needed to complete the formation of the layer.
6. At the end of the adsorption period, add approximately 26 mL of 0.1 N KOH solution. This is 2.5 equivalents of KOH relative to the moles of ferrous chloride added. It is critical to add an amount of KOH commensurate with the amount of ferrous chloride added according to the following formula:

$$\text{Volume } KOH \text{ (mL)} = \text{mass } FeCl_2 \cdot 4H_2O(g) \times \frac{1 \text{ mol}}{198.81 \text{ g}} \times 2.5 \times \frac{1 \text{ L}}{0.1 \text{ mol}} \times \frac{1000 \text{ mL}}{L} \quad \text{(eq. 1)}$$

Always round the calculated volume to be added up to the next 0.5 mL.

Add the amount of KOH slowly over about 10 seconds.

7. At a time interval no longer that 20 minutes as measured from the time KOH was added, retrieve the substrate from the bath and wash it gently and thoroughly with DI water.

As implied in step 4, deviating from the 2.5 mM concentration for ferrous chloride is acceptable, but it is vital that the volume of KOH solution be calculated using the actual mass of ferrous chloride added and the actual concentration of KOH, if it is not 0.1 M. The general formula is:

$$\text{Volume } KOH \text{ (mL)} = \frac{\text{mass } FeCl_2 \cdot 4H_2O(g) \times 2.5 \times 1000 \text{ mL/L}}{198.81 \text{ g/mol} \times [KOH]}, \quad \text{(eq. 2)}$$

where [KOH] is the concentration of KOH in molarity units (moles solute/liters of solvent).

8. Endpoint Verification: The final pH of the solution should be between 6 and 7, inclusive. This can be verified with a pH strip. The solution should also contain brown magnetite particulates that settle slowly and that respond to a magnet. If the final pH is less than 6, then add approximately 1 extra mL of KOH in order to correct for errors in mass or concentration.

Magnetic Laminate Core Layer Fabrication Process

The Co—Ni—Fe alloy layer is then deposited on the surface of the magnetite layer using conventional metal deposition techniques such as electroplating, thereby forming a magnetic laminate core layer. The process is repeated sequentially in alternating layering steps, inserting a thin cobalt layer at a preselected interval intermediate successive core layers as described above, until a multilayered magnetic structure having the desired number of layers and thickness is attained. The process protocol for the fabrication of the Co—Ni—Fe layers of the multilayered magnetic structure of the present invention is as follows:

1. Prepare a Co—Ni—Fe bath solution in vessel suitable for carrying out a galvanostatic plating process (constant current) at room temperature and pressure of the following:
   a. $CoSO_4$-$7H_2O$ at a concentration range of approximately 0.015 M to approximately 0.05 M;
   b. $NiSO_4$-$6H_2O$ at a concentration range of approximately 0.2 M to approximately 0.459 M;
   c. $NiCl_2$-$6H_2O$ at a concentration range of approximately 0.081 M;
   d. $FeSO_4$-$7H_2O$ at a concentration range of 0.01 M to approximately 0.05M;
   e. $H_3BO_3$ at a concentration range of approximately 0.136 M to approximately 0.4 M;
   f. $H_2SO_4$ in trace amounts; and
   g. Thiourea ($SC(NH_2)_2$ at a concentration of approximately 50 mg/l.
   h. Optionally, Saccharin at a concentration range of approximately 0.91 g/l to approximately 1.83 g/l.

2. Insert a substrate material into the bath solution (a seed layer such a Parylene or Si or a ferritic (magnetite) insulating layer fabricated in accordance with the methods of the present invention).

3. Initiate the plating process at a current density of approximately 7 $mA/cm^2$ to approximately 10 $mA/cm^2$ until a plating layer having a thickness in a range of approximately 1 μm to approximately 5 μm is deposited.

A thin cobalt layer may be deposited optionally on every fifth to tenth magnetic laminate core layer using a plating bath having the following components:
   a. $CoCl_2$-$6H_2O$ at a concentration of approximately 0.19 M;
   b. $CoSO_4$-$7H_2O$ at a concentration of approximately 1.17 M;
   c. $H_3BO_3$ at a concentration of approximately 0.49 M; and
   d. NaCl at a concentration of approximately 0.29 M.

Other optional additives to the Co—Ni—Fe bath solution in minimal trace amounts include sodium lauryl sulfate, ammonium chloride, glycerol, iron oxide, MSG.

Micro Fabricated Electromagnetic Device Fabrication Process

The process flow sequence for the fabrication of a micro functional electromagnetic device in accordance with the present invention is set forth below. By way of example and not of limitation, the process is described with respect to the fabrication of a micro fabricated electromagnetic transformer as shown in FIGS. 1-3; however, the features of the methods and structures herein disclosed may be applied to the fabrication of other types of microelectronic devices for application on semiconductor wafers without departing from the scope of the present invention.

1. Form a copper coil 12 based upon planar copper windings.
2. Form a crossover wire structure.
3. Form apertures and gaps adapted to receive a magnetic core in the copper coil by Si deep reactive ion etching (DRIE).
4. Remove the inter-wafer areas via wet and/or dry full-body etching.
5. Deposit blanket conformal organic isolation layer, e.g., Parylene.
6. Deposit seed layer, e.g., Si via masked full body physical vapor deposition.
7. Deposit multilayered magnetic core structure in sequential layers as described in greater detail above.

In accordance with the foregoing fabrication process steps, a multilayered micro fabricated magnetic device, by way of example, a transformer, is provided for use in demanding applications. The device of the instant invention possesses superior physical, electrical and magnetic properties heretofore unavailable in micro multilayered electronic devices via minimizing if not eliminating the disruptive effects of eddy currents normally found in multilayered materials, such as unacceptable heat generation, disrupted magnetic fields and accompanying loss of inductance and degradation of device performance.

General Interpretation of Terms

In understanding the scope of the present invention, the term "configured" as used herein to describe a component, section or part of a device that is constructed to carry out the desired function. In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the layered magnetic structure, material and manufacturing process of the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A micro multilayered electromagnetic device, comprising:
   a coil;
   a continuous closed loop laminated magnetic core, the magnetic core including a silicon microbeam,
   a dielectric substrate or seed layer operatively connected to and covering the microbeam, and
   a multilayered magnetic structure operatively connected the microbeam the multilayered magnetic structure including;
      a first layer of magnetic micro laminate material, the first layer including a magnetic cobalt-nickel-iron alloy layer operatively connected to the substrate or seed layer and a layer of iron oxide insulating material operatively connected to the magnetic cobalt-nickel-iron alloy layer, a plurality of layers of micro laminate material sequentially deposited on and operatively connected to the first layer of magnetic micro laminate, material and to one another, and
      a cobalt layer having a preselected thickness disposed intermediate every fifth to every tenth of the plurality of micro laminate material layers, whereby an inhibiting effect of a passivating oxide layer of the nickel component of the alloy to the formation of an insulating layer of iron oxide thereon is overcome.

2. The micro multilayered electromagnetic device of claim 1 wherein the iron oxide comprises hematite ($Fe_2O_3$) or magnetite ($Fe_3O_4$).

3. The micro multilayered electromagnetic device of claim 2 wherein each layer of insulating material is of a preselected thickness in the range of 0.05 μm to 0.5 μm.

4. The micro multilayered electromagnetic device of claim 3 wherein the thickness of the cobalt layer is 0.5 μm or less.

5. The micro multilayered electromagnetic device of claim 1 wherein the alloy layer comprises cobalt in a range of 25% to 45%, nickel in a range of 45% to 65%, and iron in a range of 1% to 18%.

6. The micro multilayered electromagnetic device of claim 5 wherein the magnetic laminate core has a thickness of 250 μm.

\* \* \* \* \*